(12) United States Patent
Liang et al.

(10) Patent No.: US 6,368,952 B1
(45) Date of Patent: Apr. 9, 2002

(54) DIFFUSION INHIBITED DIELECTRIC STRUCTURE FOR DIFFUSION ENHANCED CONDUCTOR LAYER

(75) Inventors: Mong-Song Liang; Syun-Ming Jang, both of Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/638,775

(22) Filed: Aug. 15, 2000

(51) Int. Cl.$^7$ ............... H01L 27/4736; H01L 21/44; H01L 29/76; H01L 31/62; H01L 29/94

(52) U.S. Cl. .............. 438/622; 438/199; 438/453; 438/672; 438/675; 438/687; 257/374; 257/499; 257/508; 257/773; 257/774

(58) Field of Search ............... 438/453, 622, 438/637, 638, 639, 640, 672, 674, 675, 687, 688, 207, 218, 219, 197, 199, 206; 257/773, 774, 776, 747, 374, 499, 508, 509

(56) References Cited

U.S. PATENT DOCUMENTS

| | | | |
|---|---|---|---|
| 5,891,513 A | | 4/1999 | Dubin et al. ............ 427/90 |
| 5,893,752 A | * | 4/1999 | Zhang et al. ............ 438/687 |
| 5,899,740 A | * | 5/1999 | Kwon ............ 438/627 |
| 6,001,415 A | * | 12/1999 | Nogami et al. ............ 427/97 |
| 6,008,117 A | | 12/1999 | Hong et al. ............ 438/629 |
| 6,016,000 A | | 1/2000 | Moslehi ............ 257/522 |
| 6,037,248 A | * | 3/2000 | Ahn ............ 438/619 |

FOREIGN PATENT DOCUMENTS

JP 11135781 * 5/1999

\* cited by examiner

Primary Examiner—Charles Bowers
Assistant Examiner—Thanhha Pham
(74) Attorney, Agent, or Firm—Tung & Associates

(57) ABSTRACT

Within a method for forming a microelectronic fabrication, there is first provided a substrate. There is then formed over the substrate a microelectronic device passivated with a patterned first dielectric layer in turn annularly surrounded by a patterned second dielectric layer. There is also formed over the substrate a patterned conductor layer separated from the microelectronic device by the patterned first dielectric layer and the patterned second dielectric layer. Within the method: (1) the patterned first dielectric layer is formed from a first dielectric material having a first diffusion coefficient with respect to a conductor material from which is formed the patterned conductor layer; (2) the patterned second dielectric layer is formed from a second dielectric material having a second diffusion coefficient with respect to the conductor material from which is formed the patterned conductor layer; and (3) the first diffusion coefficient is greater than the second diffusion coefficient.

18 Claims, 2 Drawing Sheets

DIFFUSION INHIBITED DIELECTRIC STRUCTURE FOR DIFFUSION ENHANCED CONDUCTOR LAYER

BACKGROUND OF THE INVENTION

1. Field of the Invention

The present invention relates generally to dielectric structures employed within microelectronic fabrications. More particularly, the present invention relates to diffusion inhibited dielectric structures employed with respect to diffusion enhanced conductor layers within microelectronic fabrications.

2. Description of the Related Art

Microelectronic fabrications are formed from microelectronic substrates over which are formed patterned microelectronic conductor layers which are separated by microelectronic dielectric layers. As microelectronic fabrication integration levels have increased and microelectronic device and patterned microelectronic conductor layer dimensions have decreased, it has become increasingly common in the art of microelectronic fabrication to employ copper containing microelectronic conductor materials when forming patterned microelectronic conductor layers within microelectronic fabrications. Copper containing microelectronic conductor materials are desirable in the art of microelectronic fabrication when forming patterned microelectronic conductor layers within microelectronic fabrications insofar as copper containing microelectronic conductor materials are generally recognized as superior to other types of microelectronic conductor materials which may be employed within microelectronic fabrications, such as but not limited to aluminum containing microelectronic conductor materials and tungsten containing microelectronic conductor materials which may be employed within microelectronic fabrications, particularly with respect to characteristics such as but not limited to electromigration resistance characteristics and electrical current carrying characteristics.

While copper containing microelectronic conductor materials are thus desirable in the art of microelectronic fabrication for forming patterned microelectronic conductor layers within microelectronic fabrications, copper containing microelectronic conductor materials are nonetheless not entirely without problems in the art of microelectronic fabrication for forming patterned microelectronic conductor layers within microelectronic fabrications. In that regard, copper containing microelectronic conductor materials when employed when fabricating patterned copper containing microelectronic conductor layers within microelectronic fabrications are often susceptible to interdiffusion effects, in particular with respect to silicon oxide dielectric materials which are employed for passivating microelectronic devices within microelectronic fabrications, such that there is consequently realized a compromise of the dielectric properties of the dielectric materials and a related compromise of electrical properties of the microelectronic devices.

It is thus desirable in the art of microelectronic fabrication to provide methods and materials for forming within microelectronic fabrications diffusion inhibited microelectronic dielectric structures, in particular with respect to diffusion enhanced microelectronic conductor layers, such as but not limited to copper containing diffusion enhanced microelectronic conductor layers.

It is towards the foregoing object that the present invention is directed.

Various methods and materials have been disclosed in the art of microelectronic fabrication for forming microelectronic layers, and more particularly microelectronic conductor layers, and yet more particularly copper containing microelectronic conductor layers, with desirable properties within the art of microelectronic fabrication.

For example, Dubin et al., in U.S. Pat. No. 5,891,513, discloses an electroless deposition method for efficiently forming within a microelectronic fabrication a copper containing microelectronic conductor layer upon a barrier layer within the microelectronic fabrication. To realize the foregoing result, the electroless deposition method first employs a contact displacement deposition method for forming a copper activation layer upon the barrier layer prior to forming upon the copper activation layer the copper containing microelectronic conductor layer while employing the electroless deposition method.

In addition, Hong et al., in U.S. Pat. No. 6,008,117, discloses a method for forming within a microelectronic fabrication a diffusion barrier layer for inhibiting diffusion of a copper containing microelectronic conductor layer with respect to a silicon oxide dielectric layer within the microelectronic fabrication such that there is not compromised the resistive-capacitive delay characteristics of the microelectronic fabrication. In order to realize the foregoing object, the method employs forming a metal layer over the microelectronic fabrication and forming while employing an in-situ nitridation or oxidation of the metal layer a dielectric barrier layer therefrom, prior to forming the copper containing microelectronic conductor layer thereupon.

Finally, Moslehi, in U.S. Pat. No. 6,016,000, discloses a multi-level interconnected semiconductor integrated circuit microelectronic fabrication comprising a series of patterned microelectronic conductor interconnect layers interconnected with a series of patterned microelectronic conductor stud layers, wherein there is analogously also optimized resistive-capacitive delay characteristics within the multi-level interconnected semiconductor integrated circuit microelectronic fabrication. In order to realize the foregoing object, the multi-level interconnected semiconductor integrated circuit microelectronic fabrication employs a free space medium, such as but not limited to air or helium, rather than a condensed dielectric material, such as but not limited to silicon oxide, as a dielectric material interposed between the series of patterned conductor interconnect layers which is separated and interconnected by the series of patterned conductor stud layers.

Desirable in the art of microelectronic fabrication are additional methods and materials for forming within microelectronic fabrications diffusion inhibited microelectronic dielectric structures, in particular with respect to diffusion enhanced microelectronic conductor layers, such as but not limited to copper containing diffusion enhanced microelectronic conductor layers, such as to provide enhanced passivation of microelectronic devices within microelectronic fabrications.

It is towards the foregoing object that the present invention is directed.

SUMMARY OF THE INVENTION

A first object of the present invention is to provide a method for forming within a microelectronic fabrication a diffusion inhibited microelectronic dielectric structure interposed between a microelectronic conductor layer and a microelectronic device.

A second object of the present invention is to provide a method in accord with the first object of the present invention, which method is readily commercially implemented.

In accord with the objects of the present invention, there is provided by the present invention a method for forming a microelectronic fabrication, as well as the microelectronic fabrication which results from the method for forming the microelectronic fabrication. To practice the method of the present invention, there is first provided a substrate. There is then formed over the substrate a microelectronic device passivated with a patterned first dielectric layer in turn annularly surrounded by a patterned second dielectric layer. There is also formed over the substrate a patterned conductor layer separated from the microelectronic device by the patterned first dielectric layer and the patterned second dielectric layer. Within the method of the present invention: (1) the patterned first dielectric layer is formed from a first dielectric material having a first diffusion coefficient with respect to a conductor material from which is formed the patterned conductor layer; (2) the patterned second dielectric layer is formed from a second dielectric material having a second diffusion coefficient with respect to the conductor material from which is formed the patterned conductor layer; and (3) the first diffusion coefficient is greater than the second diffusion coefficient.

The present invention provides a method for forming within a microelectronic fabrication a diffusion inhibited microelectronic dielectric structure interposed between a microelectronic conductor layer and a microelectronic device. The method of the present invention realizes the foregoing object by forming over a substrate: (1) a microelectronic device passivated with a patterned first dielectric layer in turn annularly surrounded by a patterned second dielectric layer; and (2) a patterned conductor layer separated from the microelectronic device by the patterned first dielectric layer and the patterned second dielectric layer, wherein: (1) the patterned first dielectric layer is formed from a first dielectric material having a first diffusion coefficient with respect to a conductor material from which is formed the patterned conductor layer; (2) the patterned second dielectric layer is formed from a second dielectric material having a second diffusion coefficient with respect to the conductor material from which is formed the patterned conductor layer; and (3) the first diffusion coefficient is greater than the second diffusion coefficient.

The method of the present invention is readily commercially implemented. As will be illustrated in greater detail within the context of the Description of the Preferred Embodiment which follows, the present invention employs methods and material as are otherwise generally conventional in the art of microelectronic fabrication, but employed within the context of specific constraints and geometric configurations to provide the present invention. Since it is thus a novel order of methods and construction of materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a diffusion inhibited microelectronic dielectric structure interposed between a microelectronic conductor layer and a microelectronic device. The method of the present invention realizes the foregoing object by forming over a substrate: (1) a microelectronic device passivated with a patterned first dielectric layer in turn annularly surrounded by a patterned second dielectric layer; and (2) a patterned conductor layer separated from the microelectronic device by the patterned first dielectric layer and the patterned second dielectric layer, wherein: (1) the patterned first dielectric layer is formed from a first dielectric material having a first diffusion coefficient with respect to a conductor material from which is formed the patterned conductor layer; (2) the patterned second dielectric layer is formed from a second dielectric material having a second diffusion coefficient with respect to the conductor material from which is formed the patterned conductor layer; and (3) the first diffusion coefficient is greater than the second diffusion coefficient.

Although the preferred embodiment of the present invention illustrates the present invention within the context of a diffusion inhibiting microelectronic dielectric structure passivating a field effect transistor (FET) within a semiconductor integrated circuit microelectronic fabrication to inhibit diffusion of copper from a patterned copper containing conductor layer within the vicinity of the field effect transistor (FET) within the semiconductor integrated circuit microelectronic fabrication, the present invention may alternatively be employed for inhibiting diffusion of diffusion enhanced conductor layers with respect to microelectronic devices including but not limited to resistors, transistors, diodes and capacitors within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
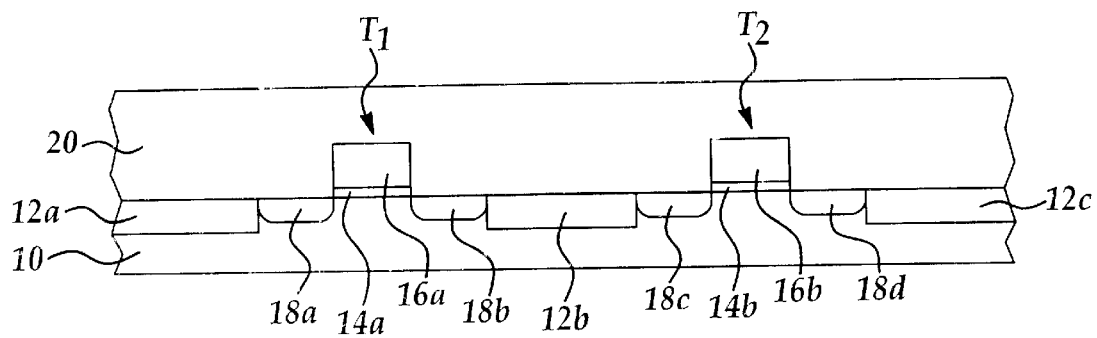
FIG. 1, FIG. 2, FIG. 3, FIG. 4, FIG. 5 and FIG. 6 show a series of schematic cross-sectional and plan-view diagrams illustrating the results of progressive stages in fabricating a microelectronic fabrication in accord with a preferred embodiment of the present invention.

Referring now to FIG. 1 to FIG. 6, there is shown a series of schematic cross-sectional and schematic plan-view diagrams illustrating the results of progressive stages in forming within a semiconductor integrated circuit microelectronic fabrication in accord with a preferred embodiment of the present invention a diffusion inhibited microelectronic dielectric structure. Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein and thereupon a series of shallow trench isolation regions 12a, 12b and 12c which defines a pair of active regions of the semiconductor substrate 10.

Within the preferred embodiment of the present invention with respect to the semiconductor substrate 10, the semiconductor substrate 10 may be formed of semiconductor materials as are conventional in the art of semiconductor integrated circuit microelectronic fabrication, such semiconductor materials being selected from the group including but not limited to doped (N- and P-) silicon semiconductor materials and compound semiconductor materials.

Similarly, within the preferred embodiment of the present invention with respect to the series of shallow trench isolation regions 12a, 12b and 12c, the series of shallow trench isolation regions 12a, 12b and 12c is typically and preferably formed of a shallow trench isolation dielectric material as is similarly also conventional in the art of semiconductor integrated circuit microelectronic fabrication, such shallow trench isolation dielectric materials being selected from the group including but not limited to silicon oxide shallow trench isolation dielectric materials, silicon nitride shallow trench isolation dielectric materials and silicon oxynitride shallow trench isolation dielectric materials.

Shown also within the schematic cross-sectional diagram of FIG. 1 formed within and upon the pair of active regions of the semiconductor substrate 10 defined by the series of shallow trench isolation regions 12a, 12b and 12c is a pair of field effect transistors (FETs) comprising a first field effect transistor T1 and a second field effect transistor T2. The pair of field effect transistors (FETs) further comprises a pair of gate dielectric layers 14a and 14b having formed and aligned thereupon a pair of gate electrodes 16a and 16b, where the pair of gate dielectric layers 14a and 14b having formed and aligned thereupon the pair of gate electrodes 16a and 16b separates within the pair of field effect transistors (FETs), as appropriate, a pair of source/drain regions 18a and 18b, or a pair of source/drain regions 18c and 18d.

Within the preferred embodiment of the present invention, each of the foregoing series of structures which comprises the pair of field effect transistors (FETs) comprising the first field effect transistor T1 and the second field effect transistor T2 may be formed employing methods and materials as are otherwise conventional in the art of semiconductor integrated circuit microelectronic fabrication for forming field effect transistors (FETs) within semiconductor integrated circuit microelectronic fabrications. In that regard, typically and preferably, each of the pair of gate dielectric layers 14a and 14b is formed to a thickness of from about 15 to about 25 angstroms from a silicon oxide gate dielectric material. Similarly, typically and preferably, each of the pair of gate electrodes 16a and 16b is formed to a thickness of from about 1,500 to about 2,500 angstroms from a doped polysilicon (of greater than about $10^{20}$ dopant atoms per cubic centimeter) or a polycide (doped polysilicon/metal silicide stack) gate electrode conductor material. Finally, typically and preferably, each of the series of source/drain regions 18a, 18b, 18c and 18d is formed employing an appropriate dopant ion implanted into portions of the active region of the semiconductor substrate not covered by the pair of gate dielectric layers 14a and 14b and the pair of gate electrodes 16a and 16b at an ion implant dose of from about 3E15 to about 7E15 dopant atoms per square centimeter and an ion implantation energy of from about 10 to about 30 keV.

Finally, there is also shown within the schematic cross-sectional diagram of FIG. 1 a blanket planarized pre-metal dielectric (PMD) layer 20 formed passivating the semiconductor integrated circuit microelectronic fabrication, including the series of structures which comprise the first field effect transistor T1 and the second field effect transistor T2 within the impair of field effect transistors (FETs).

Within the preferred embodiment of the present invention with respect to the blanket planarized pre-metal dielectric (PMD) layer 20, the blanket planarized pre-metal dielectric (PMD) layer is formed of a dielectric material susceptible to diffusion with respect to a diffusion enhanced conductor material, such as but not limited to a copper containing diffusion enhanced conductor material, which diffusion thus compromises the integrity of the blanket planarized pre-metal dielectric (PMD) layer 20 with respect to passivating the pair of field effect transistors (FETs), thus in turn potentially providing compromised electrical properties of the pair of field effect transistors (FETs). The blanket planarized pre-metal dielectric (PMD) layer 20 may thus be formed at least in part of dielectric materials including but not limited to silicon oxide dielectric materials (formed employing methods including but not limited to low pressure thermal chemical vapor deposition (LPCVD) methods, plasma enhanced chemical vapor deposition (PECVD) methods, sub-atmospheric pressure thermal chemical vapor deposition (SACVD) methods and atmospheric pressure thermal chemical vapor deposition (APCVD) methods), spin-on-glass (SOG) dielectric materials (including but not limited to silicate spin-on-glass (SOG) dielectric materials and silsesquioxane spin-on-glass (SOG) dielectric materials such as but not limited to hydrogen or fluoro silsesquioxane spin-on-glass (SOG) dielectric materials and organo or fluoro-organo silsesquioxane spin-on-glass (SOG) dielectric materials) and spin-on-polymer (SOP) dielectric materials (including but not limited to polyimide spin-on-polymer (SOP) dielectric materials, polyarylene ether (PAE) spin-on-polymer (SOP) dielectric materials and fluorinated analogs thereof). Typically and preferably, the blanket planarized pre-metal dielectric (PMD) layer 20 is formed to a thickness of from about 4,000 to about 7,000 angstroms.

Figure 2:
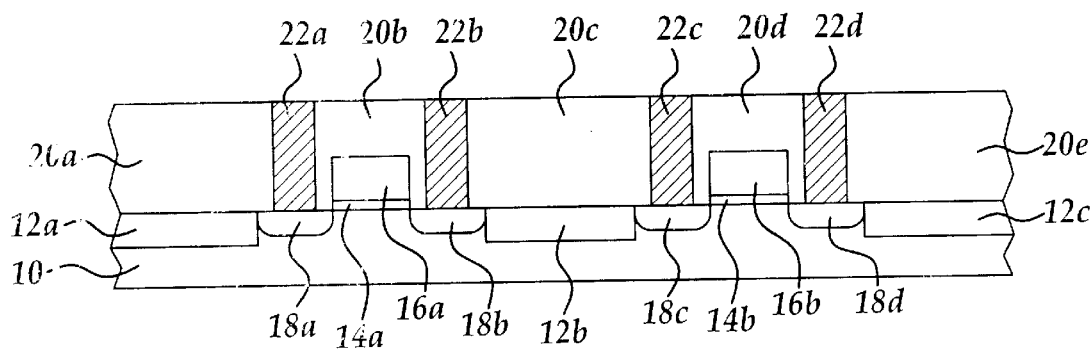

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, the blanket planarized pre-metal dielectric (PMD) layer 20 has been patterned to form a series of patterned planarized pre-metal dielectric (PMD) layers 20a, 20b, 20c, 20d and 20e which defines a series of first vias which access the series of source/drain regions 18a, 18b, 18c and 18d. Within the preferred embodiment of the present invention, the blanket planarized pre-metal dielectric (PMD) layer 20 may be patterned to form the series of patterned planarized pre-metal dielectric (PMD) layers 20a, 20b, 20c, 20d and 20e while employing photolithographic masking and etch methods as are otherwise conventional in the art of semiconductor integrated circuit microelectronic fabrication. Typically and preferably, each of the series of first vias has a linewidth of from about 0.2 to about 0.3 microns.

Shown also within the schematic cross-sectional diagram of FIG. 2 formed into the series of first vias defined by the series of patterned planarized pre-metal dielectric (PMD) layers 20a, 20b, 20c, 20d and 20e is a series of conductive contact studs 22a, 22b, 22c and 22d.

Within the preferred embodiment of the present invention, the series of conductive contact studs 22a, 22b, 22c and 22d may be formed into the series of first vias while employing methods and materials as are otherwise conventional in the art of semiconductor integrated circuit microelectronic fabrication. Typically and preferably, the series of conductive contact studs 22a, 22b, 22c and 22d is formed at least in part of a tungsten conductive material typically and preferably formed and chemical mechanical polish (CMP) planarized to a thickness sufficient to reach the upper surfaces of the series of patterned planarized pre-metal dielectric layers 20a, 20b, 20c, 20d and 20e.

Figure 3:
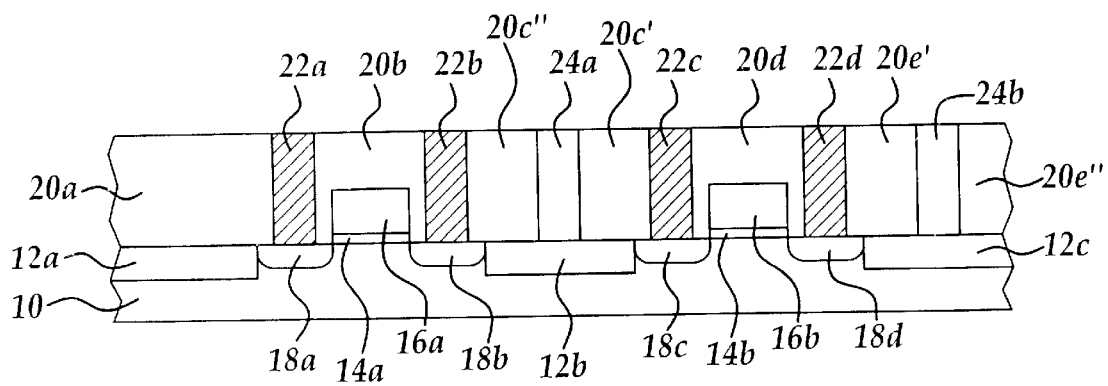

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the pair of patterned planarized pre-metal dielectric (PMD) layers 20c and 20e has been further patterned to form a series of twice patterned planarized pre-metal dielectric (PMD) layers 20c', 20c'', 20e' and 20e'' which form a pair of second apertures. The pair of patterned planarized pre-metal dielectric (PMD) layers 20c and 20e may be further patterned to form the series of twice patterned planarized pre-metal dielectric layers 20c', 20c'', 20e' and 20e'' which form the pair of second apertures while employing methods and materials analogous or equivalent to the methods and materials employed for forming from the blanket planarized pre-metal dielectric (PMD) layer 20 as illustrated within the schematic cross-sectional diagram of FIG. 1 the series of patterned planarized pre-metal dielectric layers 20a, 20b, 20c, 20d and 20e as illustrated within the schematic cross-sectional diagram of FIG. 2. Typically, each of the pair of second apertures has a linewidth of from about 500 to about 1,000 angstroms while penetrating completely through the corresponding patterned planarized pre-metal dielectric layer 20c or 20e.

There is also shown within the schematic cross-sectional diagram of FIG. 3 formed into the pair of second apertures defined by the series of twice patterned planarized pre-metal dielectric (PMD) layers 20c', 20c'', 20e' and 20e'' a pair of patterned diffusion barrier dielectric layers 24a and 24b. The pair of patterned diffusion barrier dielectric layers 24a and 24b is typically and preferably formed of a diffusion barrier dielectric material which serves as a diffusion barrier with respect to a patterned diffusion enhanced conductor layer subsequently formed over the microelectronic fabrication whose schematic cross-sectional diagram is illustrated in FIG. 3 and spaced from the pair of field effect transistors (FETs). Thus, with respect to the patterned diffusion enhanced conductor layer, the pair of patterned diffusion barrier dielectric layers 24a and 24b has a lower diffusion coefficient in comparison with the patterned planarized pre-metal dielectric (PMD) layers 20a, 20b, 20c, 20d and 20e.

Although other diffusion enhanced conductor materials may be employed when forming the patterned diffusion enhanced conductor layer, such as but not limited to gold, silver diffusion enhanced conductor materials, the patterned diffusion enhanced conductor layer is typically and preferably formed at least in part of a copper or copper containing diffusion enhanced conductor material.

The patterned diffusion barrier dielectric layers 24a and 24b may be formed of a diffusion barrier dielectric material selected from the group including but not limited to silicon nitride, silicon carbide, SiN and Sic formed employing methods including but not limited to low pressure thermal chemical vapor deposition (LPCVD) methods, plasma enhanced chemical vapor deposition (PECVD) methods, sub-atmospheric pressure thermal chemical vapor deposition (SACVD) methods and atmospheric pressure thermal chemical vapor deposition (APCVD) methods.

As is understood by a person skilled in the art, although the schematic cross-sectional diagram of FIG. 2 and the schematic cross-sectional diagram of FIG. 3 show illustrate in sequence: (1) the formation of the series of conductive stud layers 22a, 22b, 22c and 22d incident to a first patterning of the blanket planarized pre-metal dielectric (PMD) layer 20; followed by (2) the formation of the pair of patterned diffusion barrier dielectric layers 24a and 24b incident to further patterning of the blanket planarized pre-metal dielectric (PMD) layer 20, a reverse ordering of formation of the series of conductive contact studs 22a, 22b, 22c and 22d with respect to the pair of patterned diffusion barrier dielectric layers 24a and 24b is also contemplated within the context of the present invention.

Figure 4:
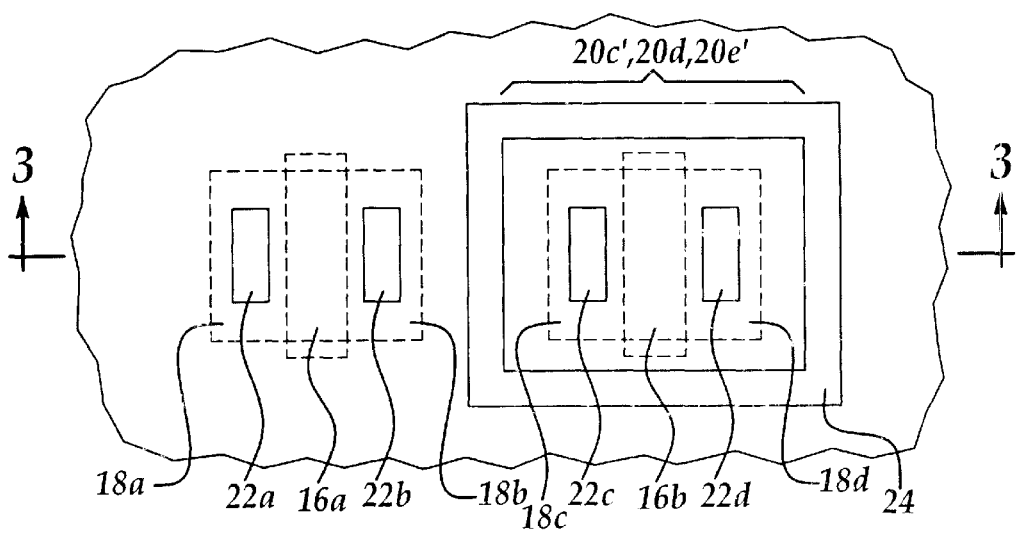

Referring now to FIG. 4, there is shown a schematic plan-view diagram of a semiconductor integrated circuit microelectronic fabrication corresponding with the semiconductor integrated circuit microelectronic fabrication whose schematic cross-sectional diagram is illustrated in FIG. 3.

As is illustrated within the schematic plan-view diagram of FIG. 4, the pair of patterned diffusion barrier dielectric layers 24a and 24b as illustrated within the schematic cross-sectional diagram of FIG. 3 comprise in part a single annular patterned diffusion barrier dielectric layer 24 which annularly surrounds the second transistor T2 which is passivated by the patterned planarized pre-metal dielectric layer 20d and the twice patterned planarized pre-metal dielectric layers 20c' and 20e', but does not annularly surround the first transistor T1.

Figure 5:
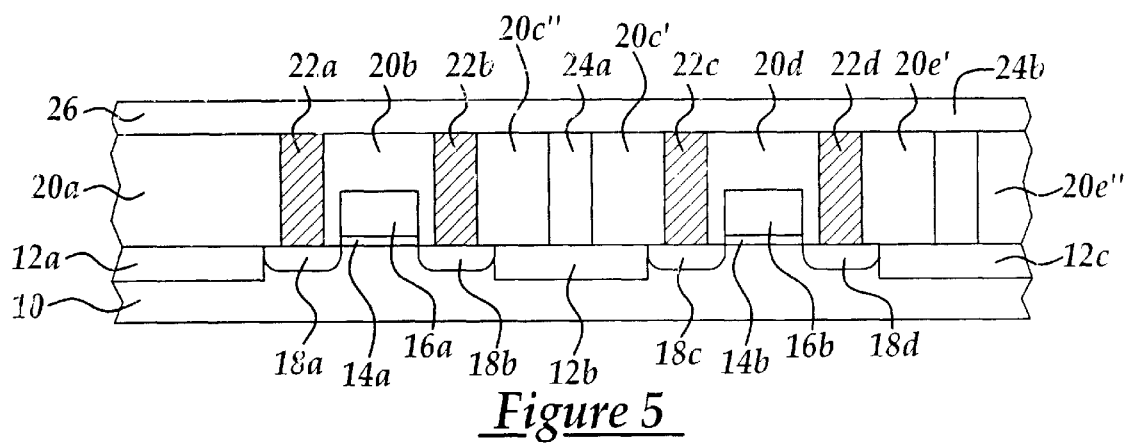

Referring now to FIG. 5, there is shown a schematic cross-sectional diagram illustrating the results of further processing of the semiconductor integrated circuit microelectronic fabrication whose schematic cross-sectional diagram is illustrated in FIG. 3 and whose schematic plan-view diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3 and whose schematic plan-view diagram is illustrated in FIG. 4, but wherein there is formed covering the semiconductor integrated circuit microelectronic fabrication a blanket capping diffusion barrier dielectric layer 26. As is understood by a person skilled in the art, the blanket capping diffusion barrier dielectric layer 26 may optionally be patterned such as to span between and contact each of the patterned diffusion barrier dielectric layers 24a and 24b. Whether patterned in such a fashion or not, the blanket capping diffusion barrier dielectric layer 26, in conjunction with the patterned diffusion barrier dielectric layers 24a and 24b, thus fully encapsulates the second transistor T2, but not the first transistor T1.

Within the preferred embodiment of the present invention, the blanket capping diffusion barrier dielectric layer 26 is formed of a diffusion barrier dielectric material analogous or equivalent to the diffusion barrier dielectric material from which is formed the patterned diffusion barrier dielectric layers 24a and 24b. Thus the blanket capping diffusion barrier dielectric layer 26 will typically and preferably also be formed of a dielectric material having an attenuated diffusion with respect to a diffusion enhanced conductor material in comparison with the blanket planarized pre-metal dielectric (PMD) layer 20 as illustrated within the schematic cross-sectional diagram of FIG. 1. Typically and preferably, the blanket capping diffusion barrier dielectric layer 26 is formed to a thickness of from about 300 to about 700 angstroms.

Figure 6:
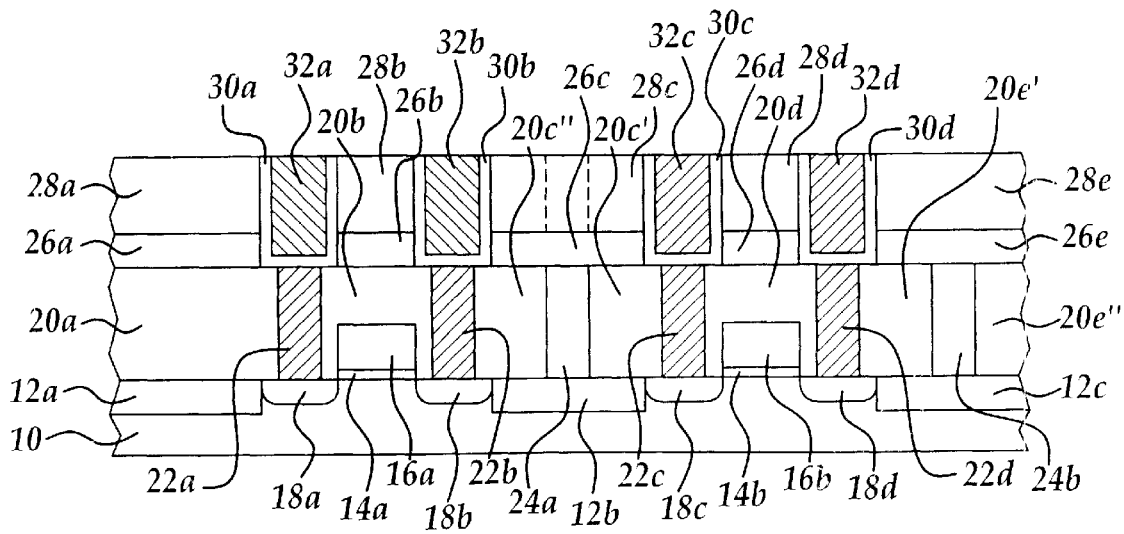

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed from the blanket capping diffusion barrier dielectric layer 26 a series of patterned capping diffusion barrier dielectric layers 26a, 26b, 26c, 26d and 26e which in turn have formed coextensively thereupon a series of patterned inter-metal dielectric (IMD) layers 28a, 28b, 28c, 28d and 28e, which series of patterned layers in an aggregate form a series of third vias.

Within the preferred embodiment of the present invention, the series of patterned capping diffusion barrier dielectric layers 26a, 26b, 26c, 26d and 26e and the series of patterned inter-metal dielectric (IMD) layers 28a, 28b, 28c, 28d and 28e are typically and preferably formed by first forming a blanket inter-metal dielectric (IMD) layer upon the blanket capping diffusion barrier dielectric layer 26 as illustrated within the schematic cross-sectional diagram of FIG. 5 and then simultaneously patterning the blanket inter-metal dielectric (IMD) layer and the blanket capping diffusion barrier dielectric layer 26 to form the corresponding series of patterned capping diffusion barrier dielectric layers 26a, 26b, 26c, 26d and 26e having formed aligned coextensively thereupon the series of patterned inter-metal dielectric (IMD) layers 28a, 28b, 28c, 28d and 28e. Typically and preferably, the blanket inter-metal dielectric (IMD) layer and the corresponding series of patterned inter-metal dielectric (IMD) layers 28a, 28b, 28c, 28d and 28e is formed to a thickness of from about 3,000 to about 5,000 angstroms from an inter-metal dielectric (IMD) material of composition analogous or equivalent to the composition of the blanket planarized pre-metal dielectric (PMD) layer 26 as illustrated in the schematic cross-sectional diagram of FIG. 1.

Finally, there is also shown within the schematic cross-sectional diagram of FIG. 6 formed into the series of third vias which is formed by the series of patterned capping diffusion barrier layers 26a, 26b, 26c, 26d and 26e and the series of patterned inter-metal dielectric (IMD) layers 28a, 28b, 28c, 28d and 28e a corresponding series of patterned conductor barrier layers 30a, 30b, 30c and 30d having formed and aligned thereupon a corresponding series of patterned interconnect layers 32a, 32b, 32c and 32d.

Within the preferred embodiment of the present invention with respect to the series of patterned conductor barrier layers 30a, 30b, 30c and 30d, the series of patterned conductor barrier layers 30a, 30b, 30c and 30d may be formed of conductor barrier materials as are conventional in the art of microelectronic fabrication, such conductor barrier materials being selected from the group including but not limited to tantalum, titanium, tantalum nitride and titanium nitride conductor barrier material, with tantalum nitride conductor barrier materials being especially preferred due in particular to superior step coverage properties of those materials. Typically and preferably, the series of patterned conductor barrier layers 30a, 30b, 30c and 30d is formed to a thickness of from about 200 to about 400 angstroms each. Finally, within the preferred embodiment of the present invention with respect to the series of patterned interconnect layers 32a, 32b, 32c and 32d, the series of patterned interconnect layers 32a, 32b, 32c and 32d is typically and preferably formed of a enhanced diffusion conductor interconnect material and in particular a copper containing enhanced diffusion conductor interconnect material which in absence of the patterned conductor barrier layers 30a, 30b, 30c and 30d, and in particular in absence of the patterned capping diffusion barrier dielectric layers 26c, 26d and 26e and in absence of the pair of patterned diffusion barrier dielectric layers 24a and 24b would otherwise diffuse into components of the second field effect transistor T2 and compromise operation of the second field effect transistor T2.

As is understood by a person skilled in the art, there may be effected within the context of the present invention additional diffusion inhibition of the patterned interconnect layers 32a and 32b with respect to the second transistor T2 by further patterning the pair of patterned inter-metal dielectric layers 28c and 28e (as shown in phantom) to form a pair of fourth apertures, and forming within the pair of fourth apertures a pair of extended patterned diffusion barrier dielectric layers which extend at least in part the pair of patterned diffusion barrier dielectric layers 24a and 24b. The extent to which such extended patterned diffusion barrier dielectric layers may be formed within the semiconductor integrated circuit microelectronic fabrication in accord with the preferred embodiment of the present invention is typically dependent upon geometric configurations of the patterned conductor barrier layers 30a, 30b, 30c and 30d and the patterned interconnect layers 32a, 32b, 32c and 32d.

As is further understood by a person skilled in the art, the semiconductor integrated circuit microelectronic fabrication whose schematic cross-sectional diagram is illustrated in FIG. 6 provides particular value under circumstances where: (1) the first transistor T1 is employed within a logic circuit which has an attenuated susceptibility to performance degradation due to diffusion; (2) the second transistor T2 is employed within a memory circuit which has an enhanced susceptibility to performance degradation due to diffusion; and (3) the first transistor T1 and the second transistor T2 are integrated and embedded within a single semiconductor substrate.

Finally, as is yet further understood by a person skilled in the art, the preferred embodiment of the present invention is illustrative of the present invention rather than limiting of the present invention. Revisions and modifications may be made to methods, materials, structures and dimensions through which may be fabricated a microelectronic fabrication in accord with the preferred embodiment of the present invention while still fabricating a microelectronic fabrication in accord with the present invention, further in accord with the accompanying claims.

What is claimed is:

1. A method for forming a microelectronic fabrication comprising:

providing a substrate;

forming over the substrate a microelectronic device passivated with a patterned first dielectric layer in turn annularly surrounded by a patterned second dielectric layer; and forming over the substrate a patterned conductor layer separated from the microelectronic device by the patterned first dielectric layer and the patterned second dielectric layer, wherein:

the patterned first dielectric layer is formed from a first dielectric material having a first diffusion coefficient with respect to a conductor material from which is formed the patterned conductor layer;

the patterned second dielectric layer is formed from a second dielectric material having a second diffusion coefficient with respect to the conductor material from which is formed the patterned conductor layer; and the first diffusion coefficient is greater than the second diffusion coefficient.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the microelectronic device is selected from the group consisting of resistors, transistors, diodes and capacitors.

4. The method of claim 1 wherein the patterned conductor layer is formed at least in part of a copper containing conductor material.

5. The method of claim 1 wherein the patterned first dielectric layer is formed of a dielectric material selected from the group consisting of silicon oxide dielectric material, spin-on-glass (SOG) dielectric materials and spin-on-polymer (SOP) dielectric materials.

6. The method of claim 1 wherein the patterned second dielectric layer is formed a dielectric material selected from the group consisting of silicon nitride dielectric material, silicon carbide dielectric materials, aluminum oxide dielectric material and titanium oxide dielectric materials.

7. The method of claim 1 further comprising over the substrate a third dielectric layer which covers the patterned second dielectric layer and in conjunction with the patterned second dielectric layer encapsulates the microelectronic device with respect to the patterned conductor layer, the third dielectric layer being formed from a third dielectric material having a third diffusion coefficient with respect to the conductor material from which is formed the patterned conductor layer, the third diffusion coefficient being less than the first diffusion coefficient.

8. The method of claim 1 further comprising forming over the substrate a second microelectronic device not annularly surrounded by the patterned second dielectric layer.

9. The method of claim 8 wherein the microelectronic device is employed within a memory circuit formed over the substrate and the second microelectronic device is employed within a logic circuit formed over the substrate.

10. A microelectronic fabrication comprising:
a substrate;
a microelectronic device formed over the substrate and passivated with a patterned first dielectric layer in turn annularly surrounded by a patterned second dielectric layer; and
a patterned conductor layer formed over the substrate and separated from the microelectronic device by the patterned first dielectric layer and the patterned second dielectric layer, wherein:

the patterned first dielectric layer is formed from a first dielectric material having a first diffusion coefficient with respect to a conductor material from which is formed the patterned conductor layer;

the patterned second dielectric layer is formed from a second dielectric material having a second diffusion coefficient with respect to the conductor material from which is formed the patterned conductor layer; and the first diffusion coefficient is greater than the second diffusion coefficient.

11. The microelectronic fabrication of claim 10 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

12. The microelectronic fabrication of claim 10 wherein the microelectronic device is selected from the group consisting of resistors, transistors, diodes and capacitors.

13. The microelectronic fabrication of claim 10 wherein the patterned conductor layer is formed at least in part of a copper containing conductor material.

14. The microelectronic fabrication of claim 10 wherein the patterned first dielectric layer is formed of a dielectric material selected from the group consisting of silicon oxide dielectric material, spin-on-glass (SOG) dielectric materials and spin-on-polymer (SOP) dielectric materials.

15. The microelectronic fabrication of claim 10 wherein the patterned second dielectric layer is formed a dielectric material selected from the group consisting of silicon nitride dielectric material, silicon carbide dielectric materials, aluminum oxide dielectric material and titanium oxide dielectric materials.

16. The microelectronic fabrication of claim 10 further comprising over the substrate a third dielectric layer which covers the patterned second dielectric layer and in conjunction with the patterned second dielectric layer encapsulates the microelectronic device with respect to the patterned conductor layer, the third dielectric layer being formed from a third dielectric material having a third diffusion coefficient with respect to the conductor material from which is formed the patterned conductor layer, the third diffusion coefficient being less than the first diffusion coefficient.

17. The microelectronic fabrication of claim 10 further comprising forming over the substrate a second microelectronic device not annularly surrounded by the patterned second dielectric layer.

18. The microelectronic fabrication of claim 17 wherein the microelectronic device is employed within a memory circuit formed over the substrate and the second microelectronic device is employed within a logic circuit formed over the substrate.

* * * * *